(12) United States Patent
Chung et al.

(10) Patent No.: US 10,700,592 B2
(45) Date of Patent: Jun. 30, 2020

(54) LOAD DETECTING DEVICE

(71) Applicant: SEMICONDUCTOR COMPONENTS INDUSTRIES, LLC, Phoenix, AZ (US)

(72) Inventors: Bong-Geun Chung, Siheung-si (KR); Taesung Kim, Seoul (KR); Gwanbon Koo, Sunnyvale, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/227,971

(22) Filed: Dec. 20, 2018

(65) Prior Publication Data

US 2019/0123634 A1 Apr. 25, 2019

Related U.S. Application Data

(63) Continuation of application No. 14/678,262, filed on Apr. 3, 2015, now Pat. No. 10,199,921.

(Continued)

(30) Foreign Application Priority Data

Apr. 2, 2015 (KR) .......................... 10-2015-0047101

(51) Int. Cl.
*H02M 1/15* (2006.01)
*H02M 3/335* (2006.01)
(Continued)

(52) U.S. Cl.
CPC ............... *H02M 1/15* (2013.01); *H02M 1/32* (2013.01); *H02M 3/33523* (2013.01);
(Continued)

(58) Field of Classification Search
CPC ...... H02M 1/15; H02M 1/32; H02M 3/33523; H02M 3/33576; H02M 2001/0035; H02M 3/07; G01R 31/04; Y02B 70/16
See application file for complete search history.

(56) References Cited

U.S. PATENT DOCUMENTS 5,148,115 A 9/1992 Koakutsu et al.
5,608,304 A * 3/1997 Okumura .............. H02J 7/0031
320/134

(Continued)

FOREIGN PATENT DOCUMENTS

JP 2012143133 A 7/2012

*Primary Examiner* — Patrick Assouad
*Assistant Examiner* — Haidong Zhang
(74) *Attorney, Agent, or Firm* — AMPACC Law Group, PLLC

(57) ABSTRACT

A load detecting device for detecting whether a load is connected to a power supply device includes a no-load condition detector configured to detect a no-load condition using a sensing voltage having a frequency variant with a switching frequency of the power supply device, a circuit configured to acquire a signal having a waveform differing according to a connection or detachment between the load and the power supply device after the no-load condition is detected by the no-load condition detector, and a detachment detector configured to detect whether the load is detached by sensing the signal acquired by the circuit.

20 Claims, 7 Drawing Sheets

Related U.S. Application Data

(60) Provisional application No. 61/974,663, filed on Apr. 3, 2014.

(51) Int. Cl.
*H02M 1/32* (2007.01)
*H02M 3/07* (2006.01)
*H02M 1/00* (2006.01)
*G01R 31/66* (2020.01)

(52) U.S. Cl.
CPC ......... *H02M 3/33576* (2013.01); *G01R 31/66* (2020.01); *H02M 3/07* (2013.01); *H02M 2001/0035* (2013.01); *Y02B 70/16* (2013.01)

(56) References Cited

U.S. PATENT DOCUMENTS

| | | | |
|---|---|---|---|
| 8,659,263 B2 | 2/2014 | Oglesbee et al. | |
| 2002/0057124 A1 | 5/2002 | Chan et al. | |
| 2009/0175060 A1* | 7/2009 | Onishi | H02J 7/025 363/56.06 |
| 2010/0028760 A1* | 2/2010 | Park | G06F 1/206 429/62 |
| 2010/0052620 A1 | 3/2010 | Wong | |
| 2010/0060233 A1 | 3/2010 | Kung et al. | |
| 2012/0020133 A1* | 1/2012 | Lee | H02M 7/2176 363/126 |
| 2013/0342240 A1* | 12/2013 | Amirkhany | H03K 5/24 327/50 |
| 2014/0169046 A1 | 6/2014 | Chen | |

\* cited by examiner

LOAD DETECTING DEVICE

CROSS-REFERENCE TO RELATED APPLICATION

This application is a continuation of U.S. patent application Ser. No. 14/678,262, filed Apr. 3, 2015, now U.S. Pat. No. 10,199,921, issued Feb. 5, 2019, which claims priority from U.S. Patent Provisional Application No. 61/974,663, filed in the United States Patent & Trademark Offices (USPTO) on Apr. 3, 2014, and Korean Patent Application No. 10-2015-0047101, filed with the Korean Intellectual Property Office on Apr. 2, 2015, the entire contents of which are incorporated herein by reference.

BACKGROUND

(a) Field

Embodiments relate to a load detecting device and more particularly to a device for detecting whether a load is connected to or detached from a power supply device.

(b) Description of the Related Art

It is necessary to detect whether a load is connected or detached in a device (hereinafter referred to as a power supply device) electrically connected to the load and configured to supply power. For example, when power is supplied to the load through a port having polarity and into which a foreign material may be easily inserted, such as a universal serial bus (USB) cable, it is recognized that the load is connected when the foreign material is inserted in place of the load and therefore the power supply device may supply power. Then, excessive heat occurs in a port in which the foreign material and the power supply device are coupled and a fire may occur in the port due to the heat.

SUMMARY

A load detecting device capable of accurately detecting whether a power supply device is connected to a load is desired to be provided.

According to an embodiment, a load detecting device for detecting whether a load is connected to a power supply device includes: a no-load condition detector configured to detect a no-load condition using a sensing voltage having a frequency varying according to a switching frequency of the power supply device; a circuit configured to acquire a signal having a waveform differing according to a connection or detachment between the load and the power supply device after the no-load condition is detected by the no-load condition detector; and a detachment detector configured to detect whether the load is detached by sensing the signal acquired by the circuit.

The circuit may include a first transistor connected to a first node and configured to perform a switching operation based on an output of the no-load condition detector and a predetermined clock signal, a connection switch configured to transfer output power of the power supply device may be connected between the first node and the power supply device, and the first transistor and the connection switch may be alternately switched after the no-load condition is detected by the no-load condition detector.

The circuit may further include a clock generator configured to generate the clock signal; and a gate configured to receive an output of the no-load condition detector and the clock signal and perform a logical operation on the output of the no-load condition detector and the clock signal.

The detachment detector may detect a waveform of a voltage of the first node and detect that the load is detached when at least one of an increasing gradient or a decreasing gradient of the detected waveform is greater than or equal to a predetermined gradient.

The load detecting device may further include: an auxiliary power supply configured to generate auxiliary power using an output voltage of the power supply device, wherein, after the no-load condition is detected by the no-load condition detector, a signal having a waveform differing according to the connection or detachment between the load and the power supply device may increase or decrease based on an output voltage of the auxiliary power supply.

The circuit may include a first transistor connected to a first node and configured to perform a switching operation based on an output of the no-load condition detector and a predetermined clock signal, a connection switch configured to transfer output power of the power supply device may be connected between the first node and the power supply device, the output voltage of the auxiliary power supply may be supplied to the first node, and the first transistor may be switched and the connection switch may be turned off after the no-load condition is detected by the no-load condition detector.

The detachment detector may detect a waveform of a voltage of the first node and detect that the load is detached when at least one of an increasing gradient or a decreasing gradient of the detected waveform is greater than or equal to a predetermined gradient. The load detecting device may further include: a charge pump configured to generate a voltage using an output voltage of the power supply device.

The circuit may include a first transistor connected to a first node and configured to perform a switching operation based on an output of the no-load condition detector and a predetermined clock signal; and a second transistor configured to supply an output voltage of the charge pump to the first node, and the first and second transistors may be alternately switched after the no-load condition is detected by the no-load condition detector.

The detachment detector may detect a waveform of a voltage of the first node and detect that the load is detached when at least one of an increasing gradient or a decreasing gradient of the detected waveform is greater than or equal to a predetermined gradient.

The circuit may include a current source configured to supply a current to a first node using an output voltage of the charge pump.

The detachment detector may detect that the load is detached when a voltage of the first node is less than a predetermined minimum voltage.

The circuit may include a current source configured to supply a current to a first node using an output voltage of the charge pump; a sensing resistor connected between an output port of the current source and a cathode connected to an input port of the charge pump; and a first transistor configured to perform a switching operation based on an output of the no-load condition detector and a predetermined clock signal and connected to the first node.

The detachment detector may detect that the load is detached when there is no voltage across the sensing resistor.

The load detecting device may further include: an auxiliary power supply configured to generate auxiliary power using an output voltage of the power supply device, wherein the circuit includes a current source configured to supply a current to a first node using an output voltage of the auxiliary power supply; a first transistor connected between an output port of the current source and a reference node and configured to perform a switching operation based on an output of the no-load condition detector and a predetermined clock signal; a sensing resistor connected between the reference node and a second node; and a third transistor connected between the reference node and the second node.

The detachment detector may detect that the load is detached when there is no voltage of the second node.

The circuit may include a current source configured to supply a current to a first node using an output voltage of the auxiliary power supply; a first transistor connected between an output port of the current source and a reference node and configured to perform a switching operation based on an output of the no-load condition detector and a predetermined clock signal; a sensing resistor connected between the first node and a second node; and a third transistor connected between the first node and the second node.

The detachment detector may detect that the load is detached when there is no voltage between the first node and the second node. A connection switch configured to transfer output power of the power supply device may be connected between the first node and the power supply device, and the connection switch and the third transistor may be turned off after the no-load condition is detected by the no-load condition detector.

DETAILED DESCRIPTION OF THE EMBODIMENTS

Figure 1:
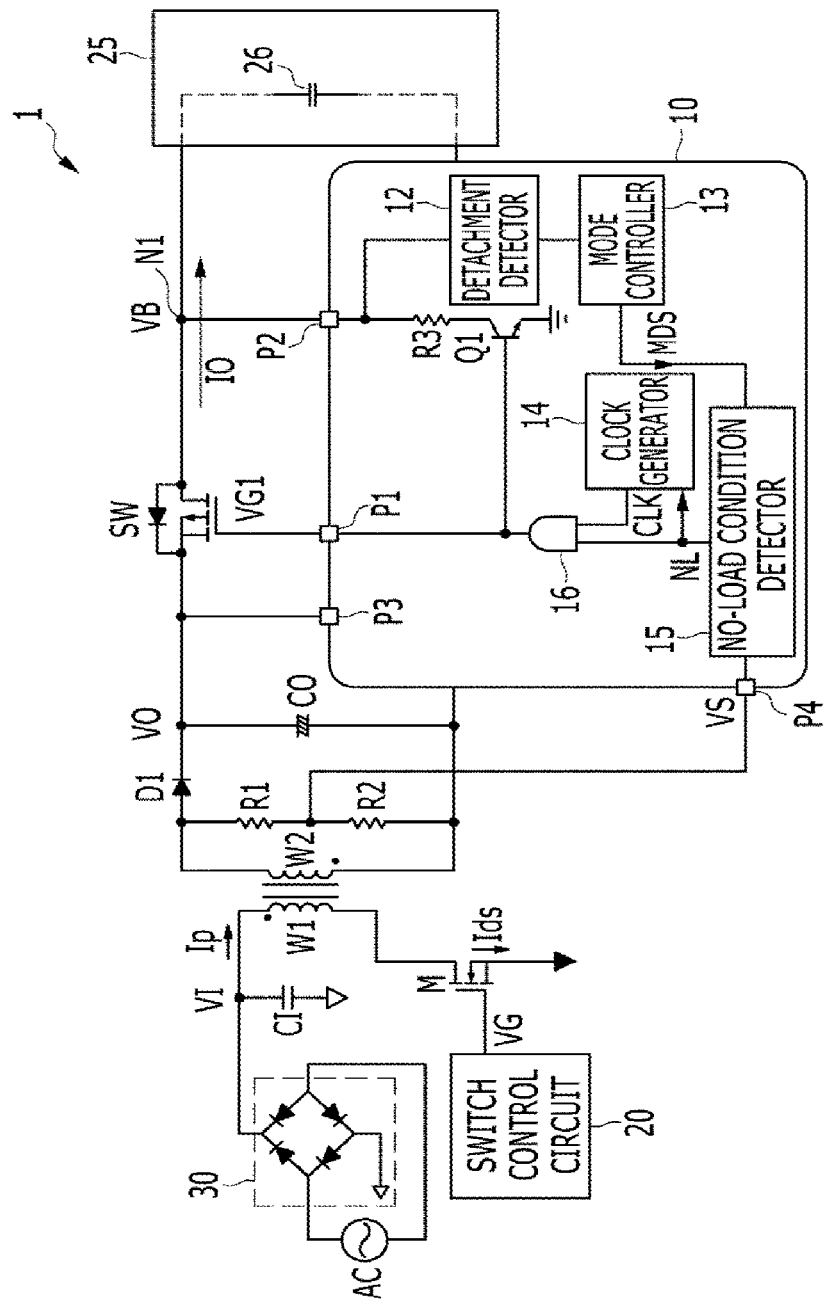
FIG. 1 is a diagram illustrating a load detecting device and a power supply device including the load detecting device according to a first embodiment.

Hereinafter, embodiments of the present invention will be described in detail with reference to the accompanying drawings to allow those of ordinary skill in the art to easily carry out the present invention. However, the embodiments of the invention may be implemented in various different forms, and the invention is not limited to the embodiments. To facilitate the entire understanding of the invention, the same reference symbols in the drawings denote the same elements, and elements which are not related to the description of the invention are omitted.

Throughout the specification, when it is described that one element is "coupled (or connected)" to the other element, the one element may be "directly coupled (or connected)" to the other element or "electrically coupled (or connected)" to the other element through a third element. Furthermore, when it is described that one element "includes (or comprises)" another element, it means that the one element does not exclude another element, but may further include other elements, unless otherwise described.

FIG. 1 is a diagram illustrating a load detecting device and a power supply device including the load detecting device according to a first embodiment.

A power supply device 1 includes a load detecting device 10, a capacitor CI, a primary-side winding W1, a secondary-side winding W2, a rectifying diode D1, a capacitor CO, a power switch M, two sensing resistors R1 and R2, a switch control circuit 20, a rectifying circuit 30, and a connection switch SW.

Although the power supply device 1 illustrated in FIG. 1 is implemented in a flyback type, the power supply device 1 may be implemented by other types of converters.

Also, in the embodiment, a transformer is used as a power transfer element for transferring power from an input to an output according to a switching operation of the power switch M. For example, a transformer implemented by the primary-side winding W1 and the secondary-side winding W2 insulated from the primary side is used as a power transfer means. However, the power transfer means connected to the power switch M is not limited thereto. An inductor may be used in place of the transformer according to a type of the converter applied to the power supply device 1.

An alternating current (AC) input is rectified through the rectifying circuit 30. The rectifying circuit 30 may be a full-bridge diode which is a full-wave rectifying circuit.

One electrode of the capacitor CI is connected to one end of the primary-side winding W1 and the other electrode of the capacitor CI is connected to the primary-side ground. Noise of the rectified AC input may be filtered through the capacitor CI. A voltage input through the capacitor CI is referred to as an input voltage VI.

The input voltage VI is transferred to the one end of the primary-side winding W1 and a drain of the power switch M is connected to the other end of the primary-side winding W1. A source of the power switch M is connected to the primary-side ground.

A gate voltage VG1 is input to a gate of the power switch M. The power switch M controls power to be transferred from the primary side to the secondary side. The primary side is insulated from the secondary side. Because the power switch M illustrated in FIG. 1 is an n-channel transistor, a level of the gate voltage VG for turning on the power switch M is a high level and a level of the gate voltage VG for turning off the power switch M is a low level.

The secondary-side winding W2 is electromagnetically connected to the primary-side winding W1. Two resistors R1 and R2 are connected in series between both ends of the secondary-side winding W2, an anode of the rectifying diode D1 is connected to one end of the secondary-side winding W2, and a cathode of the rectifying diode D1 is connected to one electrode of the capacitor CO and the source of the connection switch SW.

The voltage of the secondary-side winding W2 is divided by the two resistors R1 and R2; a sensing voltage VS is generated, and the sensing voltage VS may be used to sense a no-load condition. Although the two resistors R1 and R2 are illustrated in FIG. 1, the voltage of the secondary-side winding W2 may be input as the sensing voltage VS without resistance when an output voltage VO is low.

When the power switch M is turned on, a primary-side current Ip increases and a current Ids flows through the power switch M. During a period in which the primary-side current Ip increases, energy is stored in a core by a flux induced by the primary-side winding W1. During this period, the rectifying diode D1 is in a non-conductive state. When the power switch M is turned off and the rectifying diode D1 is conducting, the energy stored in the core is transferred to the secondary-side winding W2 and the current flows through the rectifying diode D1. In an OFF period of the power switch M, the primary-side current Ip decreases and no current Ids flows.

The connection switch SW externally transfers output power of the power supply device 1. For example, when a load 25 is connected to the drain of the connection switch SW, the current is supplied from the power supply device 1 through the connection switch SW and an output voltage VO is supplied to the load 25. The gate of the connection switch SW is connected to a connection pin P1 of the load detecting device 10. A gate voltage VG1 is input to the gate of the connection switch SW through the connection pin P1. An output current IO to be supplied to the load 25 through the connection switch SW may be determined by a period in which the current flows through the rectifying diode D1 and the current. The connection switch SW may be turned on during a period in which the load 25 is connected to the power supply device 1 and may be switched or turned off in a no-load condition in which the load 25 is not connected to the power supply device 1.

In FIG. 1, because the connection switch SW is a p-channel transistor, the level of the gate voltage VG1 for turning on the connection switch SW is the low level and the level of the gate voltage VG1 for turning off the connection switch SW is the high level.

The load 25 may include an internal capacitor 26, and, for example, may be a portable device.

According to an output voltage VO, the switch control circuit 20 may control a switching frequency or ON-duty of the power switch M. The switch control circuit 20 may acquire information about the output voltage VO in various ways. For example, a primary-side auxiliary winding (not illustrated) electromagnetically connected to the secondary-side winding W2 may be used. The switch control circuit 20 may acquire information about the output voltage VO using a voltage across the auxiliary winding during an OFF period of the power switch M. Alternatively, the current flowing through a photo transistor forming an optocoupler along with a photodiode (not illustrated) connected to the output voltage VO may be used.

When the no-load condition is sensed according to the sensing voltage VS, the load detecting device 10 supplies power to the load 25 to sense a bus voltage VB generated in the load 25 and determines whether the load 25 is connected based on the sensed bus voltage VB.

The load detecting device 10 includes a detachment detector 12, a mode controller 13, a clock generator 14, a no-load condition detector 15, an AND gate 16, a transistor Q1, and a resistor R3. Although the AND gate is used as a logical operation unit in the embodiment, other logical operation units may be used according to input and output levels.

The no-load condition detector 15 detects a no-load condition using the sensing voltage VS. For example, when the no-load condition is reached, the switch control circuit 20 decreases the switching frequency of the power switch M or controls a switching operation according to a burst mode. The frequency of a voltage across the secondary-side winding W2 differs according to the switching frequency of the power switch M or a cycle in which switching of the voltage across the secondary-side winding W2 starts changes in the case of the burst mode. The no-load condition detector 15 may sense the load state by sensing the frequency or switching start cycle of the sensing voltage VS.

The no-load condition detector 15 may determine that the state is the no-load condition when the frequency of the sensing voltage VS is less than a predetermined threshold frequency or when the switching start cycle is longer than a predetermined threshold period. The threshold frequency may be set based on the frequency of the sensing voltage VS according to the switching frequency of the power switch M in the no-load condition, and the threshold period may be set based on the switching start cycle of the sensing voltage VS according to a burst mode cycle of the power switch M in the no-load condition. When the no-load condition is detected, the no-load condition detector 15 outputs a signal NL indicating the no-load condition. For example, a level of the signal NL indicating the no-load condition may be the high level.

The clock generator 14 generates a clock signal CLK having a predetermined frequency. The clock generator 14 may operate in order to detect whether the load is connected to the power supply device 1. For example, the clock generator 14 starts an operation from the time at which the no-load condition detector 15 determines that the state is the no-load condition. That is, the clock generator 14 may operate when the high-level signal NL is input from the no-load condition detector 15. In addition, the clock generator 14 may stop the operation when it is determined that the load is connected by the mode controller 13.

The AND gate 16 generates the gate voltage VG1 by performing an AND operation on the signal NL and the clock signal CLK. That is, the AND gate 16 generates a high-level gate voltage VG1 when both of the two input signals NL and CLK have the high level and generates a low-level gate voltage VG1 when at least one of the two input signals NL and CLK has the low level.

For example, when it is determined that the power supply device 1 is in the no-load condition, the signal NL has the high level and the AND gate 16 generates the high- or low-level gate voltage VG1 according to the clock signal CLK. The AND gate 16 generates the high-level gate voltage VG1 when the clock signal CLK has the high level and generates the low-level gate voltage VG1 when the clock signal CLK has the low level.

A collector of the transistor Q1 is connected to one end of the resistor R3, a base of the transistor Q1 is connected to the AND gate 16, and an emitter of the transistor Q1 is connected to the secondary-side ground. Because the transistor Q1 is implemented as an npn bipolar junction transistor (BJT), the transistor Q1 is turned on when the gate voltage VG1, which is an output of the AND gate 16, has the high level. The other end of the resistor R3 is connected to a connection pin P2.

The detachment detector 12 receives the bus voltage VB through the connection pin P2 and detects whether the load 25 is detached from the power supply device 1 by detecting a waveform of the bus voltage VB.

For example, the detachment detector 12 determines that the load 25 is not connected to, that is, detached from, power supply device 1 when the waveform of the bus voltage VB increases at a predetermined first gradient or more or decreases at a predetermined second gradient or more. The detachment detector 12 transmits a signal indicating whether the load 25 is detached to the mode controller 13.

The mode controller 13 generates and outputs a mode signal MDS according to whether the load 25 is connected according to the output of the detachment detector 12. The mode controller 13 differently controls the level of the mode signal MDS according to whether the load 25 is connected.

When the load 25 is connected to the power supply device 1, the load detecting device 10 turns on the connection switch SW according to the mode signal MDS of a first level. For example, the no-load condition detector 15 may generate the low-level signal NL by the mode signal MDS of the first level. Then, the gate voltage VG1, which is the output of the AND gate 16, is fixed to the low level and the connection switch SW is maintained in the ON state.

When the load 25 is detached from the power supply device 1, the load detecting device 10 maintains the load detection operation according to the mode signal MDS of a second level. The load detection operation means an operation of acquiring and sensing a signal having a waveform differing according to a connection or a detachment between the load and the power supply device.

For example, a voltage or current waveform, which rises and falls repeatedly at a predetermined frequency, is supplied to a specific node to which the load 25 and the power supply device 1 are connected and the voltage of the specific node may be sensed. Alternatively, the voltage of the specific node may be sensed after a predetermined voltage or current is supplied to the specific node. Alternatively, a resistor is connected between the load 25 and the power supply device 1 and a voltage across the resistor may be sensed.

In the first embodiment, a load detection operation includes an operation of alternately switching the connection switch SW and the transistor Q1 according to the clock signal CLK, supplying a node N1 with the signal waveform that rises and falls at the frequency according to the clock signal CLK, and sensing the bus voltage VB of the node N1. At an initial time of the load detection operation, the transistor Q1 is turned on and the internal capacitor 26 may be discharged.

Specifically, the transistor Q1 is turned on and the connection switch SW is turned off by the high-level gate voltage VG1, and the connection switch SW is turned on and the transistor Q1 is turned off by the low-level gate voltage VG1. According to ON/OFF duty of the clock signal CLK, an ON/OFF period of each of the connection switch SW and the transistor Q1 may be controlled.

If the load 25 is connected to the power supply device 1, the internal capacitor 26 of the load 25 is charged with the output voltage VO during the ON period of the connection switch SW (or the OFF period of the transistor Q1). At this time, the increasing gradient of the bus voltage VB is determined according to a capacitance of the internal capacitor 26 of the load 25. For example, the increasing gradient becomes more gradual when the capacitance of the internal capacitor 26 further increases. During the ON period of the transistor Q1 (or the OFF period of the connection switch SW), the current flows from the load 25 to the secondary-side ground through the transistor Q1 and the bus voltage VB decreases. At this time, the decreasing gradient of the bus voltage VB is determined according to the capacitance of the internal capacitor 26 of the load 25. For example, the decreasing gradient becomes more gradual when the capacitance of the internal capacitor 26 further increases.

If the load 25 is detached from the power supply device 1, the bus voltage VB steeply increases during the ON period of the connection switch SW and the bus voltage VB steeply decreases during the ON period of the transistor Q1. The above-described detachment detector 12 compares at least one of the rising gradient and the falling gradient of the bus voltage VB with a predetermined threshold value and determines that the load 25 is detached from the power supply device 1 when the at least one of the rising gradient and the falling gradient is greater than or equal to the threshold value.

The present invention is not limited to the above-described embodiment and various modifications are possible.

Hereinafter, the same reference symbols are used for the same elements and detailed description thereof will be omitted.

Figure 2:
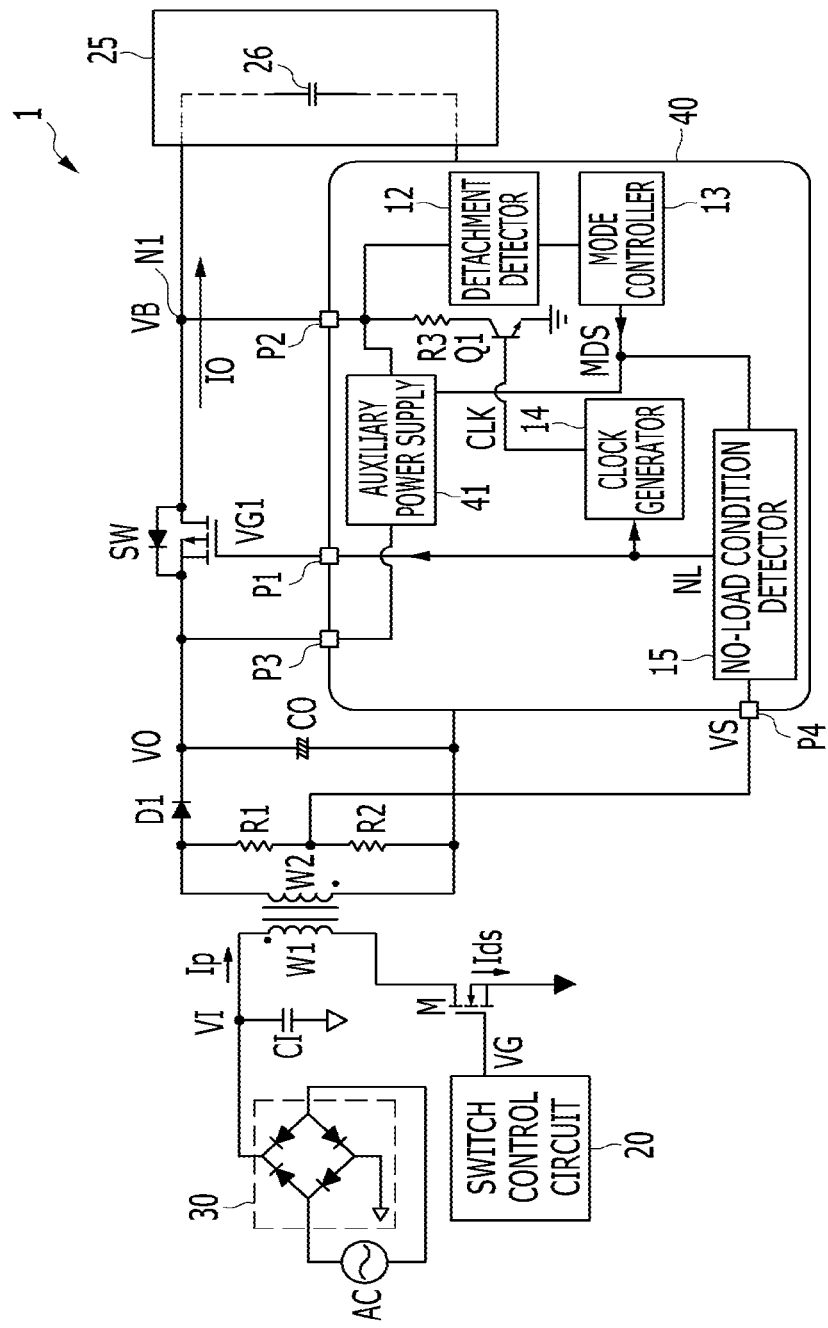
FIG. 2 is a diagram illustrating a load detecting device and a power supply device including the load detecting device according to a second embodiment.

FIG. 2 is a diagram illustrating a load detecting device and a power supply device including the load detecting device according to a second embodiment.

A load detecting device 40 according to the second embodiment further includes an auxiliary power supply 41. It is necessary to satisfy a ripple spec for an input voltage to be applied to a load 25, which is the output voltage of the power supply device. Although a connection switch SW has a characteristic of a low switching speed because the connection switch SW is for use in a large current, a switch used in the auxiliary power supply 41 may have a characteristic of a high switching frequency because the switch used in the auxiliary power supply 41 is for use in a small current. When a voltage is reduced to be less than or equal to a given lower threshold voltage which is a customer-desired ripple spec, it is possible to satisfy the ripple spec by rapidly operating the auxiliary power supply 41.

Hereinafter, a redundant description of content described with reference to FIG. 1 will be omitted.

The auxiliary power supply 41 generates auxiliary power using an output voltage VO and supplies the generated auxiliary power to the load 25. The auxiliary power supply 41 may be connected to the load 25 through a connection pin P2. The auxiliary power supply 41 is activated according to a mode signal MDS.

When the load 25 is connected to the power supply device 1, the auxiliary power supply 41 stops the operation by the mode signal MDS of a first level and the load detecting device 40 causes the connection switch SW to be turned on according to the mode signal MDS of the first level. When there is no power supplied from the auxiliary power supply 41, the power to be supplied to the load 25 may be insufficient and therefore the power may be supplied to the load 25 by immediately turning on the connection switch SW.

When the load 25 is detached from the power supply device 1, the auxiliary power supply 41 starts the operation by the mode signal MDS of a second level to generate power and the load detecting device 40 maintains a load detection operation according to the mode signal MDS of the second level.

In the second embodiment, the load detection operation includes an operation of switching a transistor Q1 according to a clock signal CLK in a state in which the connection switch SW is turned off during a period in which the power is supplied from the auxiliary power supply 41, supplying a node N1 with a signal waveform which rises and falls at a frequency according to the clock signal CLK, and sensing a bus voltage VB of the node N1. The signal waveform, which rises during an ON period of the connection switch SW and falls during the ON period of the transistor Q1 based on the output voltage of the auxiliary power supply 41, may be generated. Accordingly, the output voltage of the auxiliary power supply 41 may be an offset voltage for a voltage supplied to the load 25.

Figure 3:
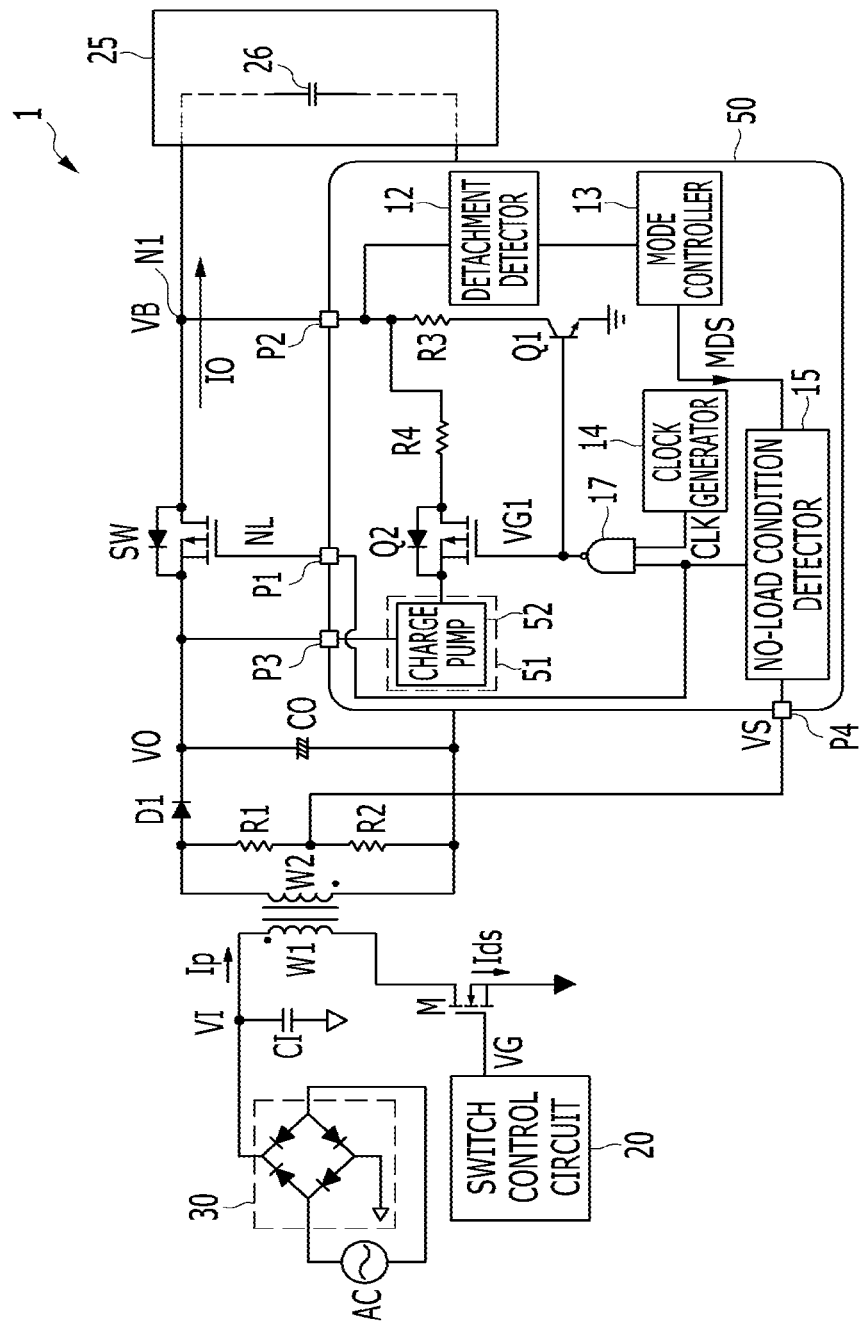
FIG. 3 is a diagram illustrating a load detecting device and a power supply device including the load detecting device according to a third embodiment.

FIG. 3 is a diagram illustrating a load detecting device and a power supply device including the load detecting device according to a third embodiment.

In the third embodiment illustrated in FIG. 3, an auxiliary power supply 51 includes a charge pump 52, and a load detecting device 50 further includes a transistor Q2 and a resistor R4. In the third embodiment, a load detection operation includes an operation of alternately switching a transistor Q1 and the transistor Q2 according to a clock signal CLK during a period in which power is supplied from the auxiliary power supply 51, supplying a node N1 with a signal waveform which rises and falls at a frequency according to the clock signal CLK, and sensing a bus voltage VB of the node N1

When a no-load condition detector 15 detects a no-load condition using a sensing voltage VS, a connection switch SW is turned off by a high-level output signal. In addition, when it is determined that a load 25 is connected to the power supply device 1 and a mode signal MDS of a first level is generated, the no-load condition detector 15 outputs a low-level signal NL and the connection switch SW is turned on.

A gate voltage VG1, which is an output of a NAND gate 17, controls switching operations of the transistor Q2 connected to the auxiliary power supply 51 and the transistor Q1. Although the NAND gate is used as a logical operation unit in the third embodiment, other logical operation units may be used according to input and output levels. Because the transistor Q2 is a p-channel transistor as illustrated in FIG. 3, the transistor Q2 is turned on by the low-level gate voltage VG1 and turned off by the high-level gate voltage VG1. Accordingly, the transistors Q1 and Q2 are alternately switched.

The charge pump 52 generates a voltage of a predetermined level using an output voltage VO. When the load 25 is connected to the power supply device 1, the output voltage of the charge pump 52 is supplied to the load 25 during the ON period of the transistor Q2. Then, an internal capacitor 26 is charged with an output voltage of the charge pump 52 and a bus voltage VB increases according to a predetermined increasing gradient. The resistor R4 is connected between two capacitors to attenuate a peak current generated by a short-circuit between a capacitor CO and the internal capacitor 26 according to the switching operation of the transistor Q2. When the transistor Q2 is turned off and the transistor Q1 is turned on, the internal capacitor 26 is connected to the secondary-side ground and discharged and the bus voltage VB decreases according to a predetermined decreasing gradient.

As described above, the increasing gradient and the decreasing gradient are determined according to a capacitance of the internal capacitor 26.

When the load 25 is detached from the power supply device 1, the bus voltage VB steeply increases during the ON period of the transistor Q2 and the bus voltage VB steeply decreases during the ON period of the transistor Q1. The detachment detector 12 may determine whether the detachment is made using at least one of the increasing gradient and the decreasing gradient of the bus voltage VB.

Figure 4:
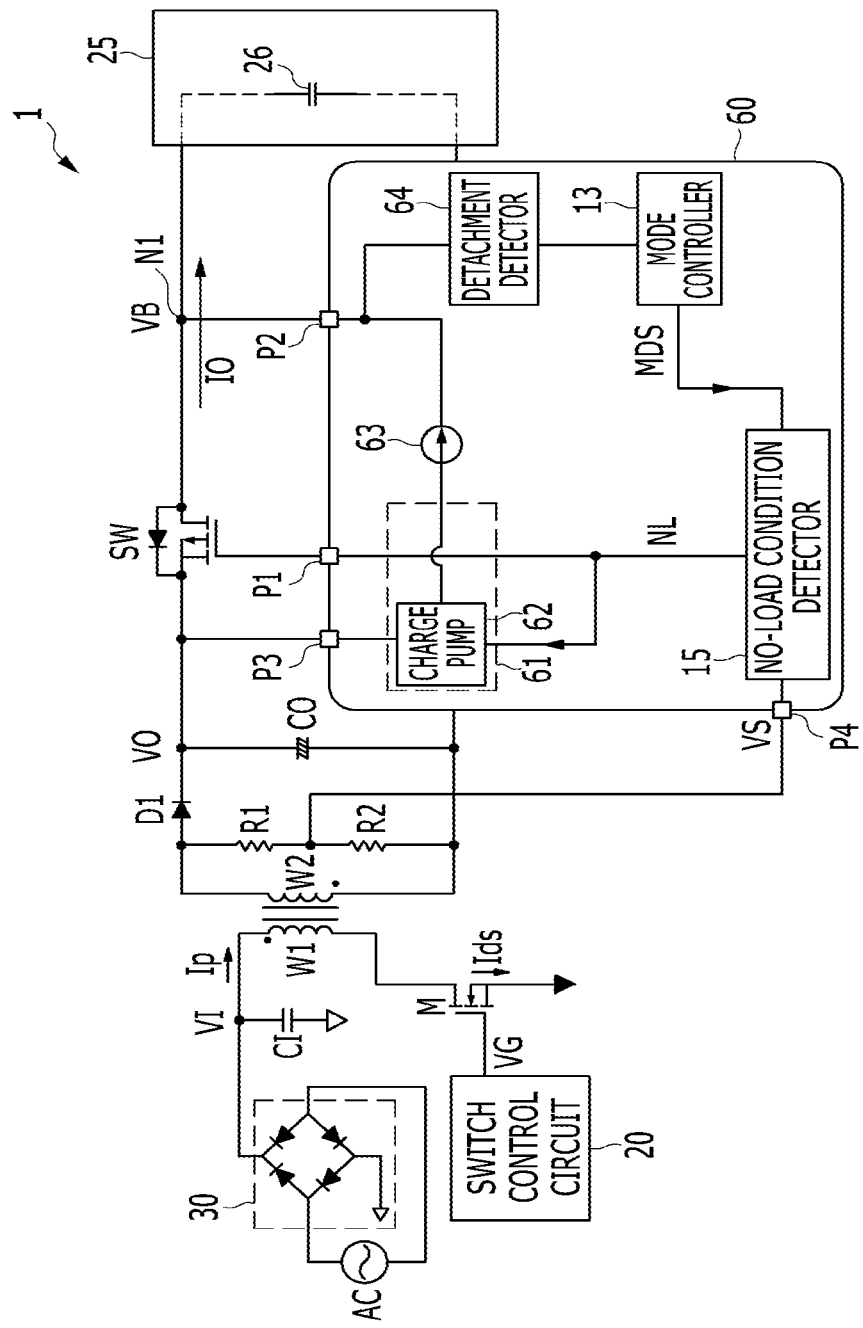
FIG. 4 is a diagram illustrating a load detecting device and a power supply device including the load detecting device according to a fourth embodiment.

FIG. 4 is a diagram illustrating a load detecting device and a power supply device including the load detecting device according to a fourth embodiment.

A load detecting device 60 according to the fourth embodiment illustrated in FIG. 4 further includes a current source 63 without including the NAND gate 17 and the two transistors Q1 and Q2 described above. Even in the fourth embodiment, as in the above-described third embodiment, a connection switch SW performs a switching operation according to an output of a no-load condition detector 15.

In the fourth embodiment, a load detection operation includes an operation of supplying a current of the current source 63 to a node N1 during a period in which power is supplied from an auxiliary power supply 61 and sensing a bus voltage VB of the node N1

The auxiliary power supply 61 includes a charge pump 62. The charge pump 62 may be operated by a high-level signal NL. The charge pump 62 generates a voltage of a predetermined level using an output voltage VO. The current source 63 generates a current using a voltage supplied from the charge pump 62. The auxiliary power supply 61 may operate only during a period in which the load detection operation is performed. A current of the current source 63 is output to the node N1 through a connection pin P2.

The current source 63 supplies a minimum current necessary for a load. If a load 25 is detached from the power supply device 1, the bus voltage VB is increased by large internal impedance coupled to the node N1. If the load 25 is connected, the impedance coupled to the node N1 is decreased by the load and therefore the bus voltage VB decreases.

Figure 5:
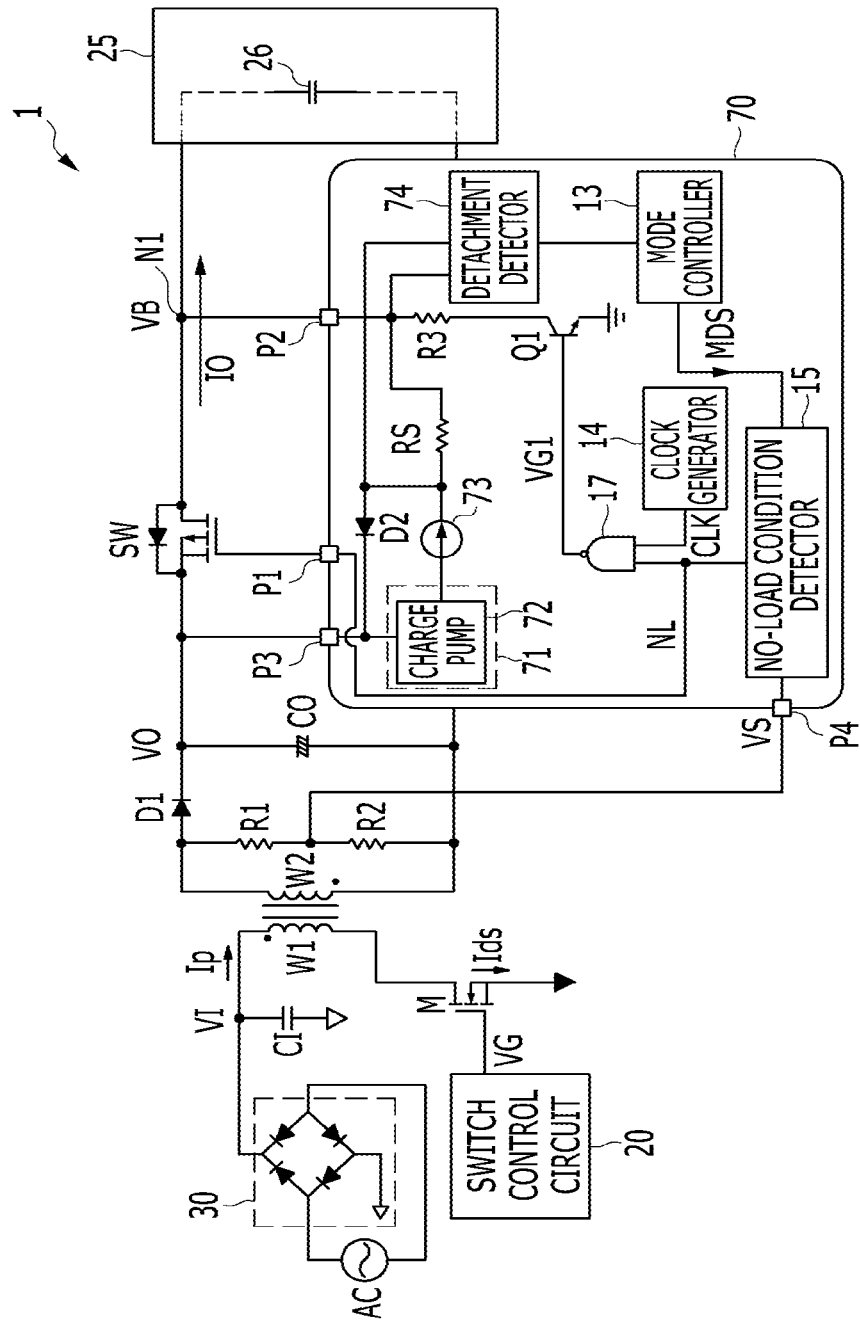
FIG. 5 is a diagram illustrating a load detecting device and a power supply device including the load detecting device according to a fifth embodiment.

FIG. 5 is a diagram illustrating a load detecting device and a power supply device including the load detecting device according to a fifth embodiment.

A load detecting device 70 according to the fifth embodiment illustrated in FIG. 5 further includes a sensing resistor RS and a diode D2 as compared with the fourth embodiment. Even in the fifth embodiment, a connection switch SW performs a switching operation according to an output of a no-load condition detector 15. For example, when the no-load condition detector 15 detects a no-load condition using a sensing voltage VS, the connection switch SW is turned off by a high-level output signal. In addition, when it is determined that a load 25 is connected to the power supply device 1 and a mode signal MDS of a first level is generated, the no-load condition detector 15 outputs a low-level signal and the connection switch SW is turned on.

A gate voltage VG1, which is an output of a NAND gate 17, controls a switching operation of a transistor Q1. Although the NAND gate 17 is used as a logical operation unit in the fifth embodiment, other logical operation units may be used according to input and output levels.

In the fifth embodiment, a load detection operation includes an operation of switching the transistor Q1 according to a clock signal CLK during a period in which power is supplied from an auxiliary power supply 71, supplying a node N1 with a signal waveform which rises and falls at a frequency according to the clock signal CLK, and sensing a bus voltage VB of the node N1.

The auxiliary power supply 71 includes a charge pump 72. The charge pump 72 generates a predetermined level voltage using an output voltage VO.

A current source 73 generates a current using an output voltage of the charge pump 72. The diode D2 includes a cathode connected to an input port of the charge pump 72, that is, the output voltage VO, and an anode connected to an output port of the current source 73. When the load 25 is detached from the power supply device 1, the current of the current source 73 flows to the charge pump 72 through the diode D2.

One end of the sensing resistor RS is connected to the output port of the current source 73 and the other end of the sensing resistor RS is connected to the node N1 through a connection pin P2.

A detachment detector 74 detects whether the load 25 is detached from the power supply device 1 by sensing a voltage between one end and the other end of the sensing resistor RS.

When the load 25 is connected to the power supply device 1, the transistor Q1 is turned on by a high-level gate voltage VG1 and an internal capacitor 26 is discharged through the transistor Q1. In addition, when the transistor Q1 is turned off by a low-level gate voltage VG1, the current of the current source 73 is supplied to the internal capacitor 26 through the sensing resistor RS. That is, the current flows through the sensing resistor RS to generate a voltage. When the detachment detector 74 senses the voltage across the sensing resistor RS, it is possible to determine that the load 25 is connected to the power supply device 1.

When the load 25 is detached from the power supply device 1, the current of the current source 73 is free-wheeled to the charge pump 72 through the diode D2 if the transistor Q1 is turned off by the low-level gate voltage VG1. Accordingly, no current flows through the sensing resistor RS and there is no voltage across the sensing resistor RS. When there is no voltage across the sensing resistor RS, the detachment detector 74 may determine that the load 25 is detached from the power supply device 1.

Figure 6:
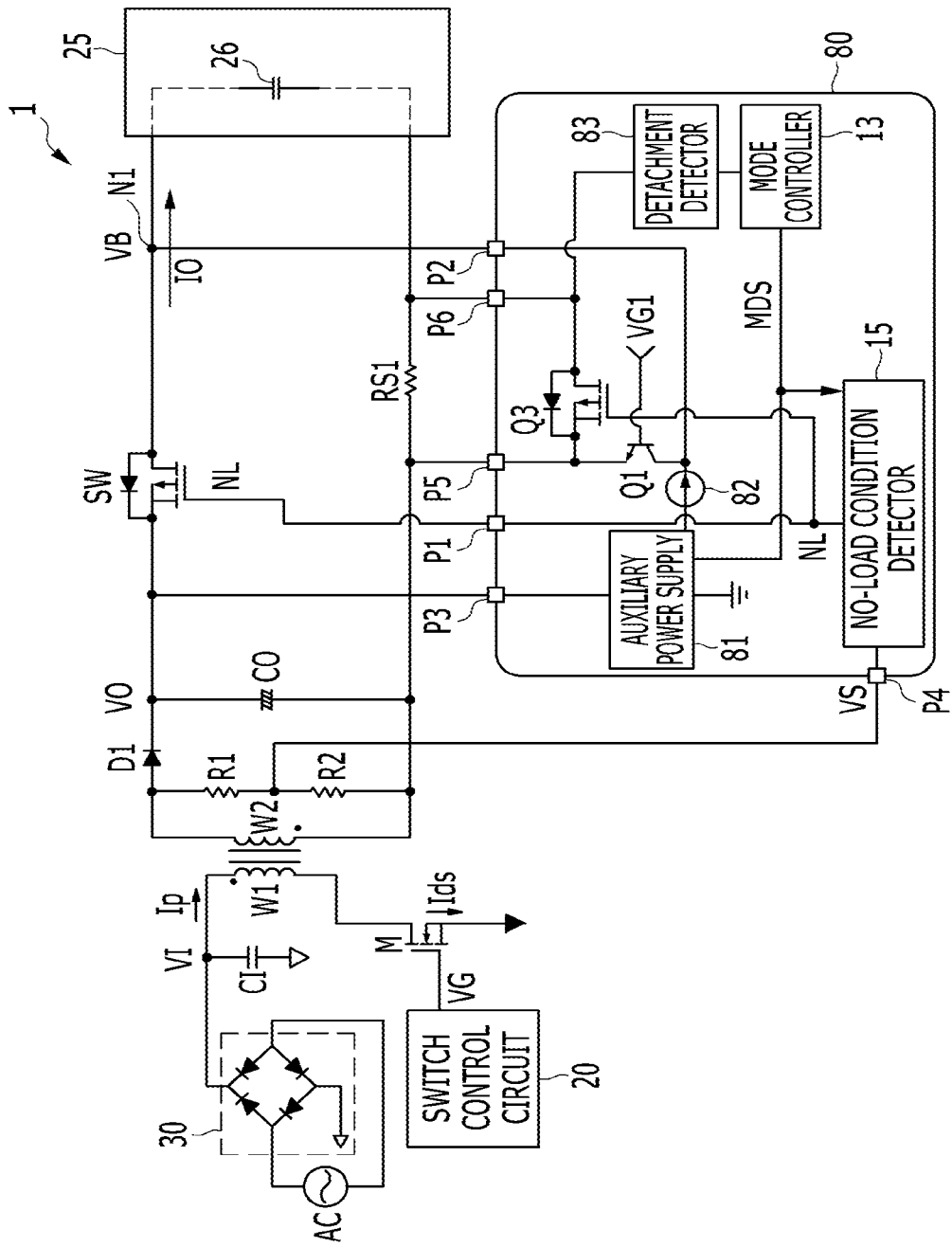
FIG. 6 is a diagram illustrating a load detecting device and a power supply device including the load detecting device according to a sixth embodiment.

FIG. 6 is a diagram illustrating a load detecting device and a power supply device including the load detecting device according to a sixth embodiment.

A load detecting device 80 illustrated in FIG. 6 further includes an auxiliary switch Q3, and a sensing resistor RS1 is connected between a load 25 and the secondary-side ground.

An auxiliary power supply 81 supplies a voltage to a current source 82 using an output voltage VO. The current source 82 generates a current using the output voltage of the auxiliary power supply 81. The current of the current source 82 may be supplied to a load 25 through a connection pin P2.

In the sixth embodiment, a load detection operation includes an operation of sensing whether the current flows through the sensing resistor RS1 to generate a voltage while switching a transistor Q1 during a period in which power is supplied from the auxiliary power supply 81.

The transistor Q1 performs a switching operation at a predetermined frequency. As in the above-described embodiments, a gate voltage VG1 based on a clock signal CLK is generated and the gate voltage VG1 may be supplied to a base of the transistor Q1. A collector of the transistor Q1 is connected to an output port of the current source 82 and an emitter of the transistor Q1 is connected to the secondary-side ground and one end of the sensing resistor RS1 through a connection pin P5. The secondary-side ground is only an example of a reference node and the embodiment is not limited thereto.

As a p-channel transistor, the transistor Q3 is connected to two ends of the sensing resistor RS1 through the connection pin P5 and a connection pin P6. A signal NL is supplied to the gate of the transistor Q3. A source of the transistor Q3 is connected to one end of the sensing resistor RS1 through the connection pin P5 and a drain of the transistor Q3 is connected to the other end of the sensing resistor RS I through the connection pin P6.

A detachment detector 83 is connected to the other end of the sensing resistor RS1 through the connection pin P6. The detachment detector 83 may detect whether the detachment is made by sensing a voltage across the sensing resistor RS1. The detachment detector 83 transmits a signal indicating whether the detachment is made to a mode controller 13 and the mode controller 13 determines a level of a mode signal MDS according to whether the detachment is made.

The auxiliary power supply 81 may maintain an operation according to the mode signal MDS of a second level and stop an operation according to the mode signal MDS of a first level. A no-load condition detector IS may maintain the high-level signal NL according to the mode signal MDS of the second level and generate the low-level signal NL according to the mode signal MDS of the first level.

Before the transistor Q3 is turned off by the signal NL which is an output of the no-load condition detector IS, no current flows through the sensing resistor RS1 because the two ends of the sensing resistor RS 1 are in a short-circuited state by the transistor Q3.

When the no-load condition detector 15 senses the no-load condition and the signal NL has the high level, the transistor Q3 and a connection switch SW are turned off.

When the load 25 is connected to the power supply device 1 in the OFF states of the transistor Q3 and the connection switch SW, the current of the current source 82 flows to the secondary-side ground through the transistor Q1 during an ON period of the transistor Q1. Then, no current flows through the sensing resistor RS 1 and there is no voltage across the sensing resistor RS1. During the OFF period of the transistor Q1, the current of the current source 82 flows to the sensing resistor RS1 through the load 25 and there is a voltage across the sensing resistor RS1. When the voltage across the sensing resistor RS1 is sensed, the detachment detector 83 may detect that the load 25 is connected to the power supply device 1.

When the load 25 is detached from the power supply device 1 in the OFF states of the transistor Q3 and the connection switch SW, the current of the current source 82 flows to the secondary-side ground through the transistor Q1 during the ON period of the transistor Q1. Then, no current flows through the sensing resistor RS1 and there is no voltage across the sensing resistor RS1. Even in the OFF period of the transistor Q1, no current of the current source 82 flows through the sensing resistor RS1 and there is no voltage across the sensing resistor RS1. When the voltage across the sensing resistor RS1 is not sensed, the detachment detector 83 may detect that the load 25 is detached from the power supply device 1.

Figure 7:
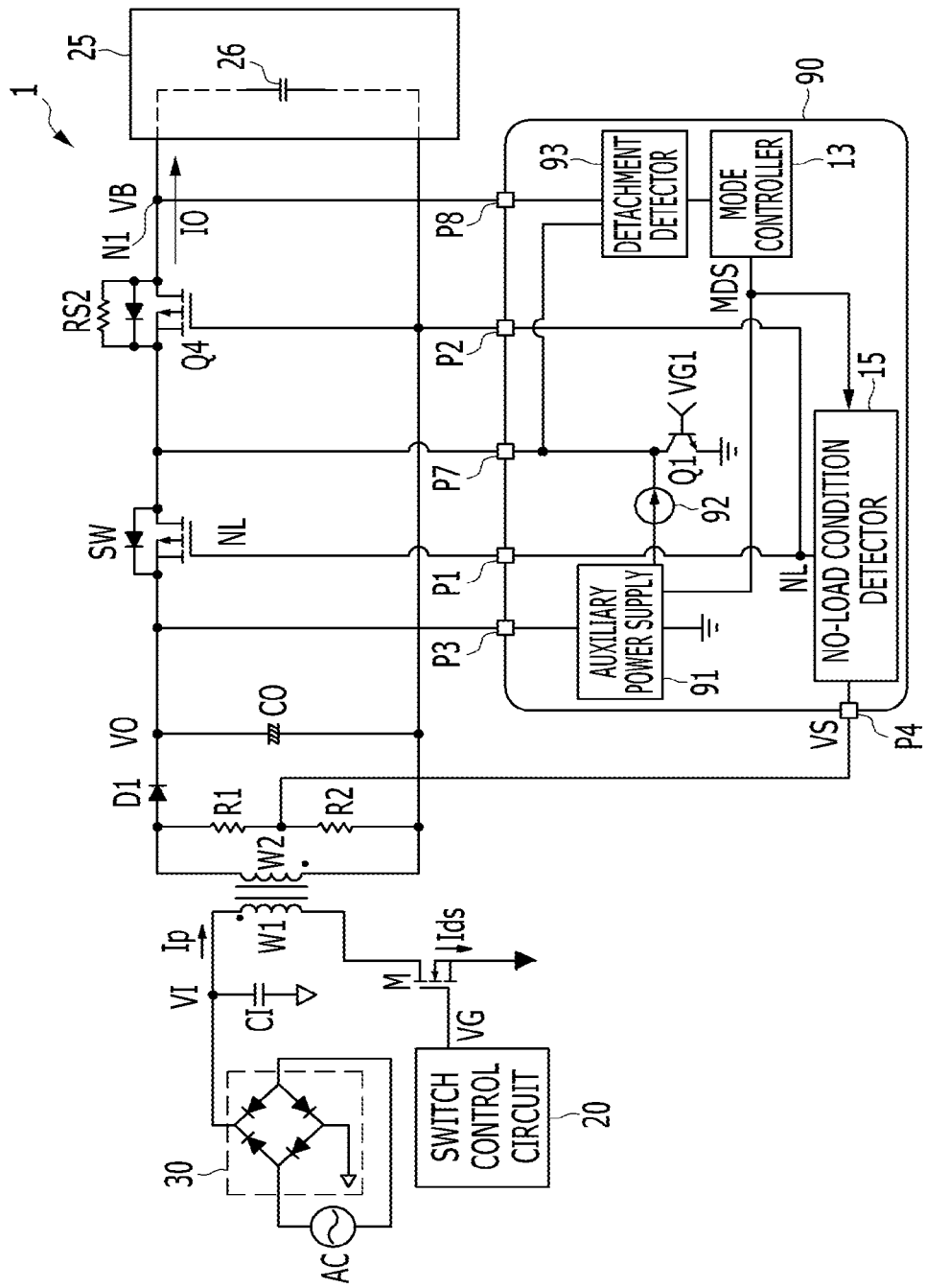
FIG. 7 is a diagram illustrating a load detecting device and a power supply device including the load detecting device according to a seventh embodiment.

FIG. 7 is a diagram illustrating a load detecting device and a power supply device including the load detecting device according to a seventh embodiment.

Compared to the sixth embodiment illustrated in FIG. 6, a sensing resistor RS2 and a transistor Q4 are formed outside a load detecting device 90. For example, one end of the sensing resistor RS2 is connected to a drain of a connection switch SW and the other end of the sensing resistor RS2 is connected to a load 25. A signal NL is supplied to the connection switch SW and a gate of the transistor Q4, a source of the transistor Q4 is connected to one end of the sensing resistor RS2, and a drain of the transistor Q4 is connected to the other end of the sensing resistor RS2. Because two ends of the sensing resistor RS2 are short-circuited during an ON period of the transistor Q4, there is no voltage across the resistor RS2.

In the seventh embodiment, a load detection operation includes an operation of sensing whether a current flows through the sensing resistor RS2 to generate a voltage while switching a transistor Q1 during a period in which power is supplied from an auxiliary power supply 91.

A collector of the transistor Q1 is connected to one end of the sensing resistor RS2 through a connection pin P7, a gate voltage VG1 is supplied to a base of the transistor Q1, and an emitter of the transistor Q1 is connected to the secondary-side ground.

A detachment detector 93 is connected to the two ends of the sensing resistor RS2 through the connection pin P7 and a connection pin P8, a voltage across the sensing resistor RS2 is sensed, and whether a detachment is made is detected according to the sensed voltage.

Because the other components and an inter-component connection relationship are the same as those of the sixth embodiment, detailed description thereof will be omitted.

When the load 25 is connected to the power supply device 1 in the OFF states of the transistor Q4 and the connection switch SW, a current of a current source 92 flows to the secondary-side ground through the transistor Q1 during the ON period of the transistor Q1. Then, no current flows through the sensing resistor RS2 and there is no voltage across the sensing resistor RS2. During the OFF period of the transistor Q1, the current of the current source 92 flows to the load 25 through the sensing resistor RS2 and a voltage across the sensing resistor RS2 is generated. When the voltage across the sensing resistor RS2 is sensed, the detachment detector 93 may detect that the load 25 is connected to the power supply device 1.

When the load 25 is detached from the power supply device 1 in the OFF states of the transistor Q4 and the connection switch SW, the current of the current source 92 flows to the secondary-side ground through the transistor Q1 during the ON period of the transistor Q1. Then, no current flows through the sensing resistor RS2 and there is no voltage across the sensing resistor RS2. Even in the OFF period of the transistor Q1, no current of the current source 92 flows through the sensing resistor RS2 and there is no voltage across the sensing resistor RS2. When the voltage across the sensing resistor RS2 is not sensed, the detachment detector 93 may detect that the load 25 is detached from the power supply device 1.

According to various embodiments described above, it is possible to supply a voltage or current to a load using an auxiliary power supply when a no-load condition is detected and detect a connection or a detachment between the load and a power supply device using a voltage differing according to the connection or detachment of the load.

While embodiments of the invention have been described in detail above, the protection scope of the present invention is not limited to the foregoing embodiment, and it will be appreciated by those skilled in the art that various modifications and improvements using the basic concept of the invention defined in the appended claims are also included in the protection scope of the present invention.

DESCRIPTION OF SYMBOLS

1: Power supply device
10, 40, 50, 60, 70, 80, 90: Load detecting device
41, 51, 61, 71, 81, 91: Auxiliary power supply
12: Detachment detector
13: Mode controller
14: Clock generator
15: No-load condition detector
16: AND gate
17: NAND gate
20: Switch control circuit
30: Rectifying circuit

What is claimed is:

1. A circuit for detecting an attachment of a load, the circuit comprising:
   a first switch coupled to a node, wherein the load may be attached to the node;
   a clock generator circuit to generate a clock signal;
   a switch control circuit to turn the first switch on and off according to the clock signal when a no-load signal is asserted; and
   a detachment detector circuit to determine whether the load is attached to the node by comparing a slope of a voltage at the node to a predetermined value, the slope of the voltage being in response to the first switch being turned on or off.

2. The circuit of claim 1,
   wherein comparing the slope of the voltage at the node to the predetermined value includes determining the slope of the voltage at the node and comparing the slope to the predetermined value,
   wherein the predetermined value is a predetermined slope; and
   wherein the load is determined to be attached to the node in response to the slope of the voltage at the node being greater than the predetermined slope.

3. The circuit of claim 1,
   wherein comparing the slope of the voltage at the node to the predetermined value includes determining the slope of the voltage at the node and comparing the slope to the predetermined value;
   wherein the predetermined value is a predetermined slope; and
   wherein the load is determined to be attached to the node in response to the slope of the voltage at the node being less than the predetermined slope.

4. The circuit of claim 1, further comprising:
   a connection switch coupled between a power source and the node and controlling a current to the node;
   wherein the switch control circuit turns the connection switch on and the first switch off when the no-load signal is deasserted and turns the connection switch off when the no-load signal is asserted.

5. The circuit of claim 4, further comprising:
   an auxiliary power supply circuit to supply a current to the node when the connection switch is turned off.

6. The circuit of claim 5, wherein the auxiliary power supply circuit comprises a charge pump circuit.

7. The circuit of claim 1, wherein the power source is a switched mode power supply, and further comprising:
   a no-load condition detector circuit to determine the no-load signal according to a frequency or a cycle time of the power source.

8. A circuit for detecting an attachment of a load to a node, the circuit comprising:
   a connection switch having a first conduction terminal coupled to a power source and a second conduction terminal coupled to the node;
   a clock generator circuit to generate a clock signal;
   a first switch coupled to the node and turned on and off according to the clock signal; and
   a detachment detector circuit to determine whether the load is attached to the node according to a comparison of a slope of a voltage of the node when the first switch is turned on to a predetermined threshold value.

9. The circuit of claim 8,
   wherein the detachment detector circuit determines that the load is attached to the node in response to the slope of the voltage at the node being greater than the predetermined threshold value.

10. The circuit of claim 8,
wherein the detachment detector circuit determines that the load is attached to the node in response to the slope of the voltage at the node being less than the predetermined threshold value.

11. The circuit of claim 8, wherein the first switch operates to sink a current from the node when the first switch is on.

12. The circuit of claim 8, further comprising:
an auxiliary power supply circuit,
wherein the first switch operates to supply a current from the auxiliary power supply circuit to the node when the first switch is on.

13. The circuit of claim 12, further comprising:
a second switch turned on and off according to the clock signal,
wherein the second switch operates to sink a current from the node when the second switch is on.

14. The circuit of claim 8, further comprising:
a no-load condition detector circuit to determine a no-load signal according to a frequency or a cycle time of the power source,
wherein the connection switch is turned off and on according to the no-load signal, and
wherein the first switch is turned off and on according to the no-load signal and the clock signal.

15. A method of determining whether a load is attached to a node of a circuit, the method comprising:
generating, using a clock circuit, a clock signal;
switching a first switch on and off using the clock signal; and
when the first switch is on, determining, by a detachment detector circuit, whether a load is attached to the node by:
determining a slope of a voltage of the node,
comparing the slope of the voltage of the node to a predetermined threshold value, and
determining whether the load is attached according to the result of the comparison.

16. The method of claim 15, wherein determining whether the load is attached according to the result of the comparison includes determining that the load is attached in response to the slope of the voltage of the node being greater than the predetermined threshold value.

17. The method of claim 15, further comprising:
determining, using a no-load determination circuit, a no-load signal;
turning on a connection switch when the no-load signal is deasserted, the connection switch being coupled between a power supply and the node; and
turning off the connection switch when the no-load signal is asserted,
wherein switching the first switch on and off comprises:
turning the first switch off when the no-load signal is deasserted, and
switching the first switch on and off using the clock signal when the no-load signal is asserted.

18. The method of claim 17, further comprising:
sourcing a current from the power supply to the node using the connection switch when the connection switch is turned on; and
sinking a current from the node to ground using the first switch when the first switch is turned on.

19. The method of claim 18, further comprising:
sourcing a current from an auxiliary power supply circuit to the node using a second switch when the connection switch is turned off.

20. The method of claim 17, wherein the power supply is a switched mode power supply, and further comprising:
asserting, by the no-load determination circuit, the no-load signal in response to a frequency of the power supply being below a frequency threshold or in response to a switching start cycle being longer than a predetermined threshold period.

\* \* \* \* \*